United States Patent
Tsutsumi et al.

(10) Patent No.: US 7,026,890 B2
(45) Date of Patent: Apr. 11, 2006

(54) DUPLEXER WITH A LADDER FILTER AND A MULTIMODE FILTER ON THE SAME SUBSTRATE

(75) Inventors: Jun Tsutsumi, Kawasaki (JP); Shogo Inoue, Kawasaki (JP); Takashi Matsuda, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 77 days.

(21) Appl. No.: 10/830,023

(22) Filed: Apr. 23, 2004

(65) Prior Publication Data
US 2004/0212453 A1    Oct. 28, 2004

(30) Foreign Application Priority Data
Apr. 25, 2003    (JP)    ............................. 2003-121871

(51) Int. Cl.
*H03H 9/72* (2006.01)
*H03H 9/64* (2006.01)

(52) U.S. Cl. ...................... 333/133; 333/193
(58) Field of Classification Search ............... 333/133, 333/193
See application file for complete search history.

(56) References Cited

U.S. PATENT DOCUMENTS

| | | | |
|---|---|---|---|
| 5,874,869 A * | 2/1999 | Ueda et al. ................. | 333/193 |
| 2002/0109561 A1 | 8/2002 | Iwamoto et al. ............ | 333/133 |
| 2003/0214369 A1* | 11/2003 | Kearns ....................... | 333/133 |
| 2004/0075511 A1* | 4/2004 | Inoue et al. ................ | 333/133 |
| 2004/0155730 A1* | 8/2004 | Iwamoto et al. ............ | 333/193 |

\* cited by examiner

*Primary Examiner*—Barbara Summons
(74) *Attorney, Agent, or Firm*—Arent Fox PLLC

(57) ABSTRACT

A duplexer includes a ladder filter and a multimode filter that are formed on the same surface of a predetermined substrate. In this duplexer, a first comb-like electrode of the ladder filter and a second comb-like electrode of the multimode filter have the same layer structure with the same film thickness. The first comb-like electrode and the second comb-like electrode are formed with single-layer films mainly containing aluminum. The relationship among the film thickness h of the first comb-like electrode and the second comb-like electrode, the center frequency $f_1$ of the frequency band of the ladder filter, and the center frequency $f_2$ of the frequency band of the multimode filter, is expressed as:

$$300 \leq h \times f_1 \leq 480$$

$$300 \leq h \times f_2 \leq 430.$$

6 Claims, 13 Drawing Sheets

TRANSITION BAND VARIATION OF LADDER FILTER 110

TRANSITION BAND VARIATION OF MULTIMODE FILTER 120

TRANSITION BAND VARIATION OF LADDER FILTER 120

Change of filter characteristics of ladder filter 120 in case that h × f1 is varied

DUPLEXER WITH A LADDER FILTER AND A MULTIMODE FILTER ON THE SAME SUBSTRATE

BACKGROUND OF THE INVENTION

1. Field of the Invention

The present invention generally relates to duplexers, and more particularly, to a duplexer having surface acoustic wave filters formed on one substrate.

2. Description of the Related Art

Antenna duplexers each having two surface acoustic wave (SAW) filters are used for 800 MHz band portable telephone devices and mobile communication devices today. These SAW filters employed in antenna duplexers are required to have high power durability to perform stable operations and to achieve long lives. Accordingly, the two filters of each duplexer have normally been formed with ladder filters that have SAW devices connected in a ladder-like fashion and exhibit relatively high power durability.

As there has been an increasing demand for smaller-sized portable telephone devices and mobile communication devices, SAW filters that can be relatively easily made smaller in size are preferred for antenna duplexers used for 1.9 GHz band mobile communication systems (such as Personal Communications Services (PCS) for the North American market, for example).

To produce smaller-sized antenna duplexers is expected whether it is for an 800 MHz band device or a 1.9 GHz band device. A smaller-sized antenna duplexer can be produced by forming two SAW filters on one substrate (as disclosed in Japanese Patent Application No. 2002-237739, for example).

However, two SAW filters formed on a small substrate in an attempt to produce a smaller device cause problems such as a decrease in the degree of stop-band suppression and an increase in crosstalk between transmission signals and reception signals. These problems are conspicuous especially in 1.9 GHz band antenna duplexers than in 800 MHz band antenna duplexers, and for this reason, it has been difficult to produce 1.9 GHz band antenna duplexers utilizing SAW filters.

So as to eliminate the problem of crosstalk between transmission signals and reception signals, two SAW filters are formed on two separate substrates to produce an antenna duplexer.

However, the SAW filters should preferably be formed simultaneously on one substrate to produce an antenna duplexer. One of the reasons for this is to realize a small-sized antenna duplexer. The other reasons are as follows. When two SAW filters are formed on two separate substrates, the center frequencies of the two SAW filters fluctuate with variations in the electrode film thickness and electrode finger width between process batches. As a result, the gap between the center frequencies fluctuate by twice as much as the fluctuation of the center frequency of each SAW filter, causing large variations in the characteristics of antenna duplexers. When two SAW filters are formed simultaneously on one substrate, on the other hand, the center frequencies of the two SAW filters are not affected by variations in the electrode film thickness and the electrode finger width. Accordingly, the gap between the two center frequencies does not vary greatly, and antenna duplexers with desired filter characteristics can be obtained. As described above, the characteristics of each antenna duplexer are greatly affected by the gap between the center frequencies of the two SAW filters. It is therefore preferable to form two SAW filters simultaneously on one substrate to achieve a higher yield.

As already mentioned, there are market demands for higher-frequency antenna duplexers and smaller-sized antenna duplexers. If these demands are to be met, however, the crosstalk between transmission signals and reception signals increases. Therefore, it has been very difficult to achieve good filter characteristics.

SUMMARY OF THE INVENTION

It is therefore an object of the present invention to provide duplexers in which the above disadvantage is eliminated.

A more specific object of the present invention is to provide a duplexer that has two or more SAW filters on a single substrate and exhibits excellent filter characteristics with less crosstalk.

The above objects of the present invention are achieved by a duplexer comprising a ladder filter and a multimode filter that are formed on the same surface of a predetermined substrate, a first comb-like electrode of the ladder filter and a second comb-like electrode of the multimode filter having the same layer structure with the same film thickness, the first comb-like electrode and the second comb-like electrode being formed with single-layer films mainly containing aluminum, the relationship among the film thickness h of the first comb-like electrode and the second comb-like electrode, the center frequency $f_1$ of the frequency band of the ladder filter, and the center frequency $f_2$ of the frequency band of the multimode filter, being expressed as:

$$300 \leq h \times f_1 \leq 480$$

$$300 \leq h \times f_2 \leq 430.$$

The above objects of the present invention are also achieved by a duplexer comprising a ladder filter and a multimode filter that are formed on the same surface of a piezoelectric substrate, a first comb-like electrode of the ladder filter and a second comb-like electrode of the multimode filter having the same layer structure with the same film thickness, the first comb-like electrode and the second comb-like electrode being formed with single-layer films mainly containing aluminum, or single- or multi-layer films including n layers (n being an integer of 1 or greater), the n layers including a layer mainly containing a metal other than aluminum, the relationship among the film thickness $h_k$ of the kth layer (k being an integer of 1 or greater) of the first comb-like electrode and the second comb-like electrode, the specific gravity $a_k$ of the metal of the kth layer with respect to aluminum, the center frequency $f_1$ of the frequency band of the ladder filter, and the center frequency $f_2$ of the frequency band of the multimode filter, being expressed as:

$$300 \leq f_1 \times \sum_{k=1}^{n} (a_k \times h_k) \leq 480$$

$$300 \leq f_1 \times \sum_{k=1}^{n} (a_k \times h_k) \leq 430$$

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

First Embodiment

Figure 1:
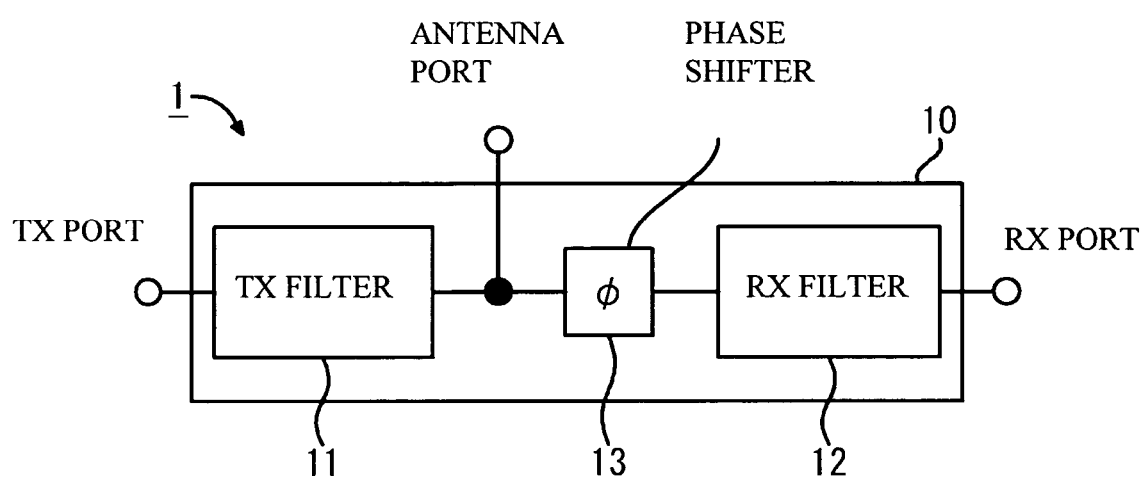
FIG. 1 is a block diagram illustrating the structure of a duplexer in accordance with a first embodiment of the present invention.

A first embodiment of the present invention will be first described in detail. FIG. 1 is a block diagram illustrating the structure of a duplexer 1 in accordance with this embodiment. The duplexer 1 has surface acoustic wave (SAW) filters (a transmission filter 11 and a reception filter 12) formed on a substrate 10. So as to maintain excellent filter characteristics in spite of a decrease in the size of the duplexer and the use of high frequency, one of the two filters 11 and 12 is formed by a ladder filter, and the other is formed by a multimode filter. A phase shifter 13 that is a matching circuit for matching input impedances is provided on the line that connects the SAW filters 11 and 12 to an antenna port 15 serving as a common terminal of the SAW filters 11 and 12.

Figure 2:
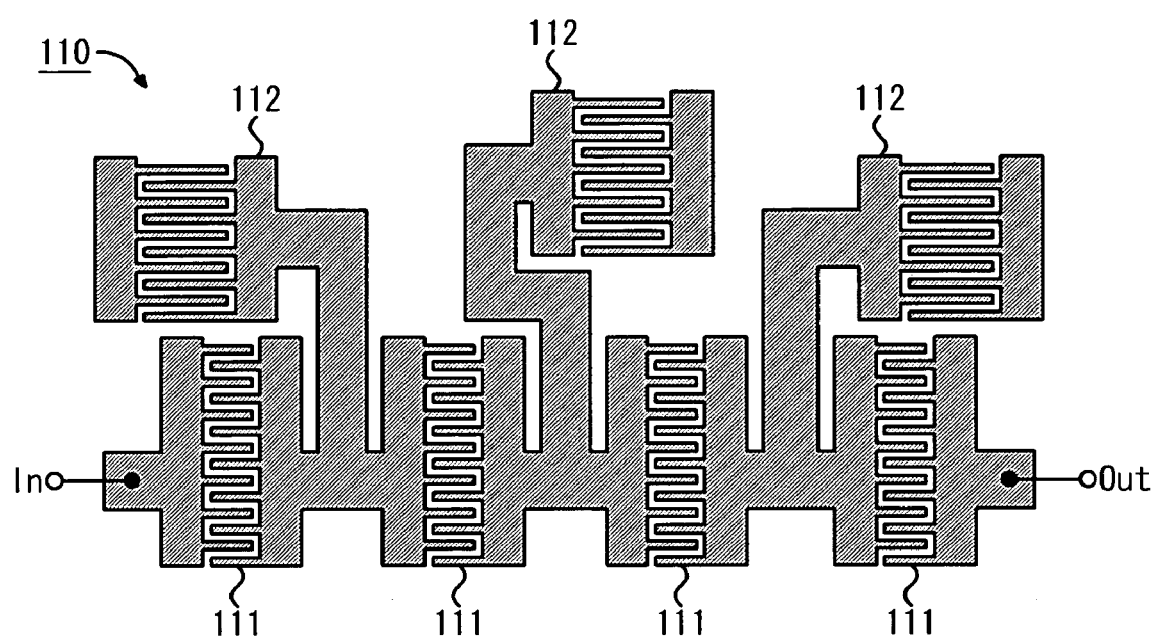
FIG. 2 is a top view of a ladder filter to be employed in the duplexer in accordance with the first embodiment.

FIG. 2 shows an example structure of a ladder filter. As shown in FIG. 2, a ladder filter 110 includes comb-like electrodes (interdigital transducers; hereinafter referred to as the IDTs) 111 connected in series, and IDTs 112 connected in parallel to the IDTs 111. Here, resonators that include the IDTs 111 connected in series are series-arm resonators, and resonators that include the IDTs 112 connected in parallel are parallel-arm resonators. The series-arm resonators are arranged in series arms while the parallel-arm resonators are arranged in parallel arms in a ladder-like structure.

Figure 3:
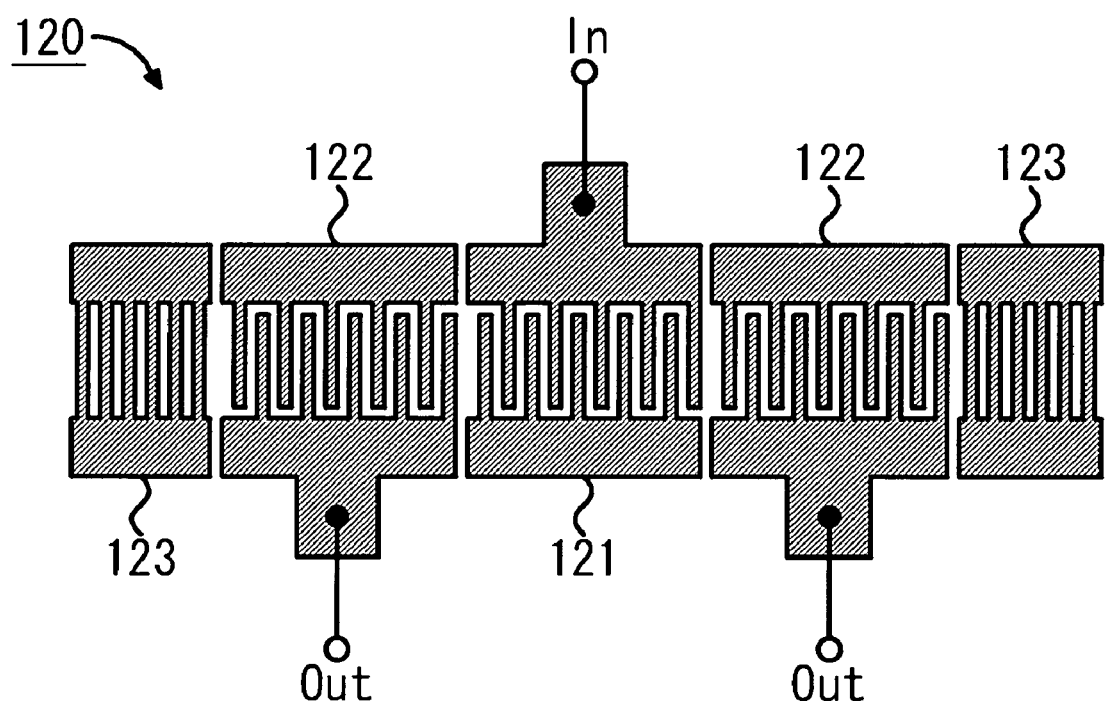
FIG. 3 is a top view of a multimode filter to be employed in the duplexer in accordance with the first embodiment.

On the other hand, a multimode filter exhibits a great degree of stop-band suppression over a wider frequency range than the ladder filter 110 does. FIG. 3 shows the structure of a multimode filter 120. As shown in FIG. 3, the multimode filter 120 includes an IDT 121 and two IDTs 122 arranged transversely, with a reflection electrode 123 being provided on either end of the arrangement. The IDT 121 is connected to the input end, while the IDTs 122 are connected to the output end. In the multimode filter 120, SAW is excited, propagated and received. The structure shown in FIG. 3 is the same as the structure of a double-mode SAW (DMS) filter among several types of multimode filters.

As the ladder filter 110 having the above structure is an electric circuit having the SAW resonators as an impedance device formed by the IDTs 111 and 112, the degree of stop-band suppression of the ladder filter 110 is not as great as that of the multimode filter 120, due to adverse influence of stray capacitance, or the like. Accordingly, one of the SAW filters 11 and 12 of the duplexer 1 is embodied by the multimode filter 120, so as to reduce crosstalk between transmission signals and reception signals. This structure will be described below, with reference to FIGS. 4 and 5.

Figure 4:
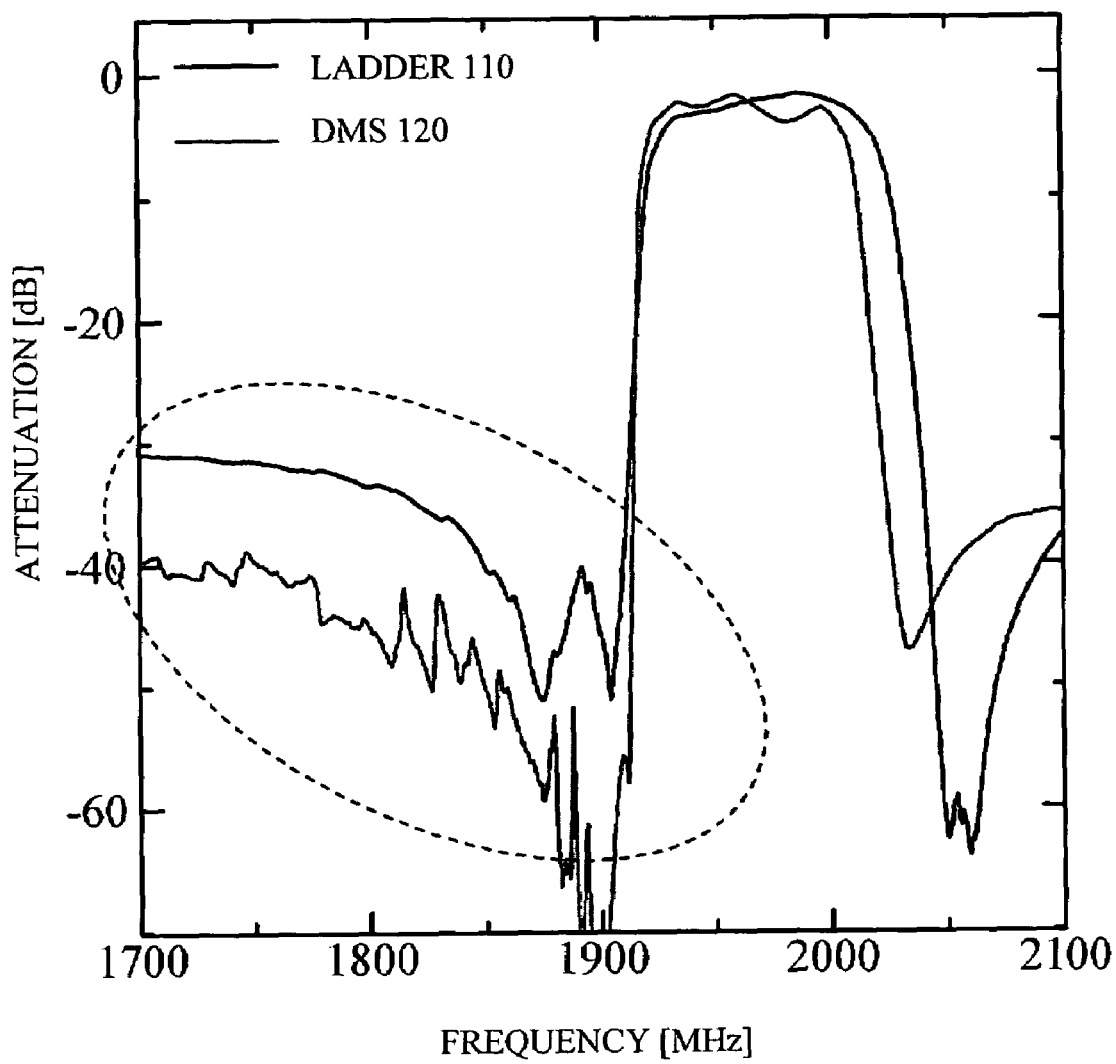
FIG. 4 is a graph showing the filter characteristics of the ladder filter shown in FIG. 2 and the filter characteristics of the multimode filter shown in FIG. 3.

FIG. 4 shows the filter characteristics of the ladder filter 110 and the filter characteristics of the multimode filter 120. As is apparent from FIG. 4, the ladder filter 110 and the multimode filter 120 each exhibits a very small insertion loss in a certain frequency band. Accordingly, the ladder filter 110 and the multimode filter 120 can be considered to have the same filter characteristics in terms of pass band insertion loss. As for the stop-band suppression on the low frequency side (represented by the region surrounded by the broken line in FIG. 4), the multimode filter 120 excels the ladder filter 110 by approximately 10 dB.

Figure 5:
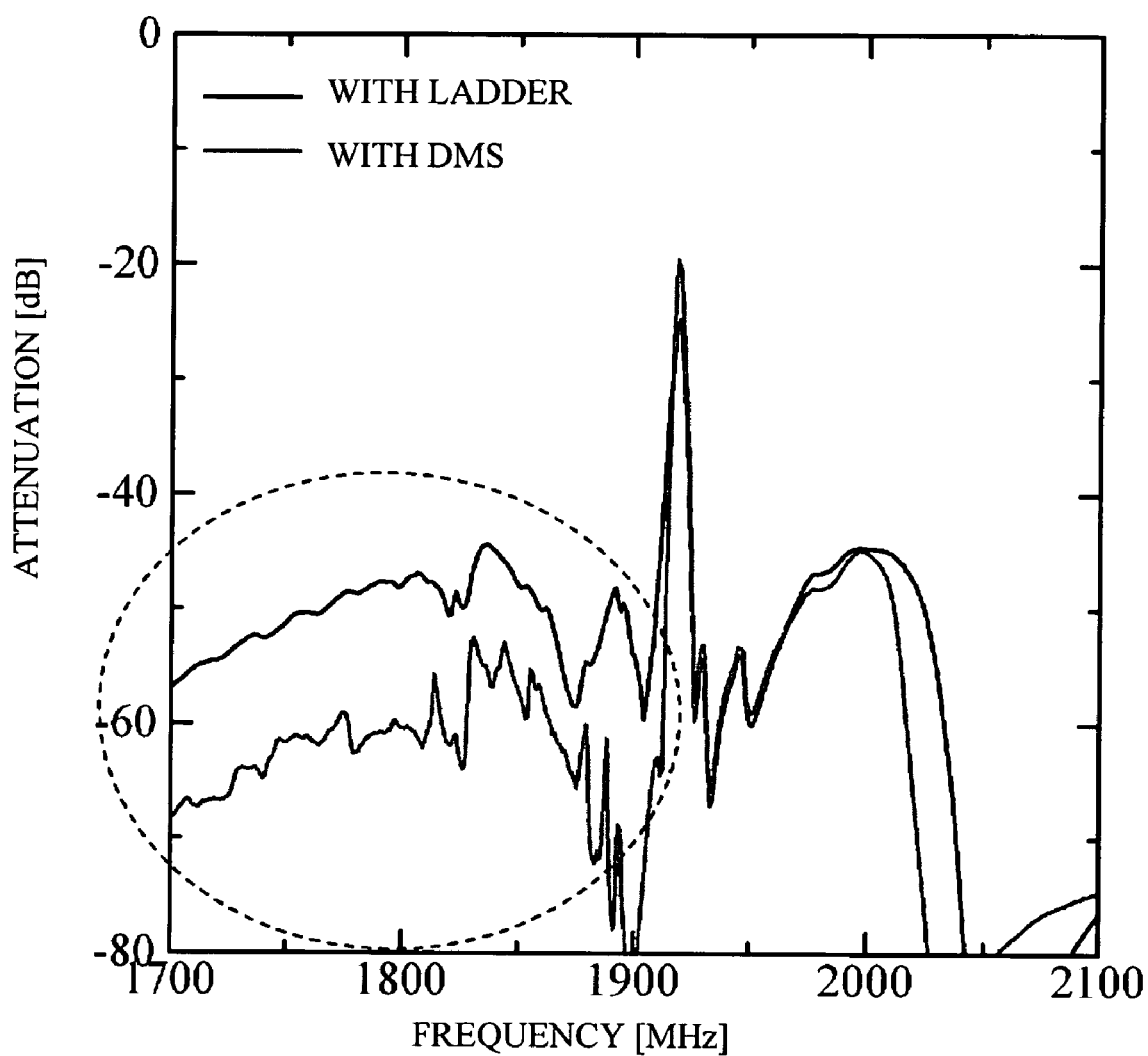
FIG. 5 is a graph showing the results of simulations performed to examine the crosstalk from the transmission side to the reception side in the case of employing the multimode filter of FIG. 3 as the higher-frequency filter of the duplexer and in the case of employing the ladder filter of FIG. 2 as the higher-frequency filter of the duplexer.
Figure 6:
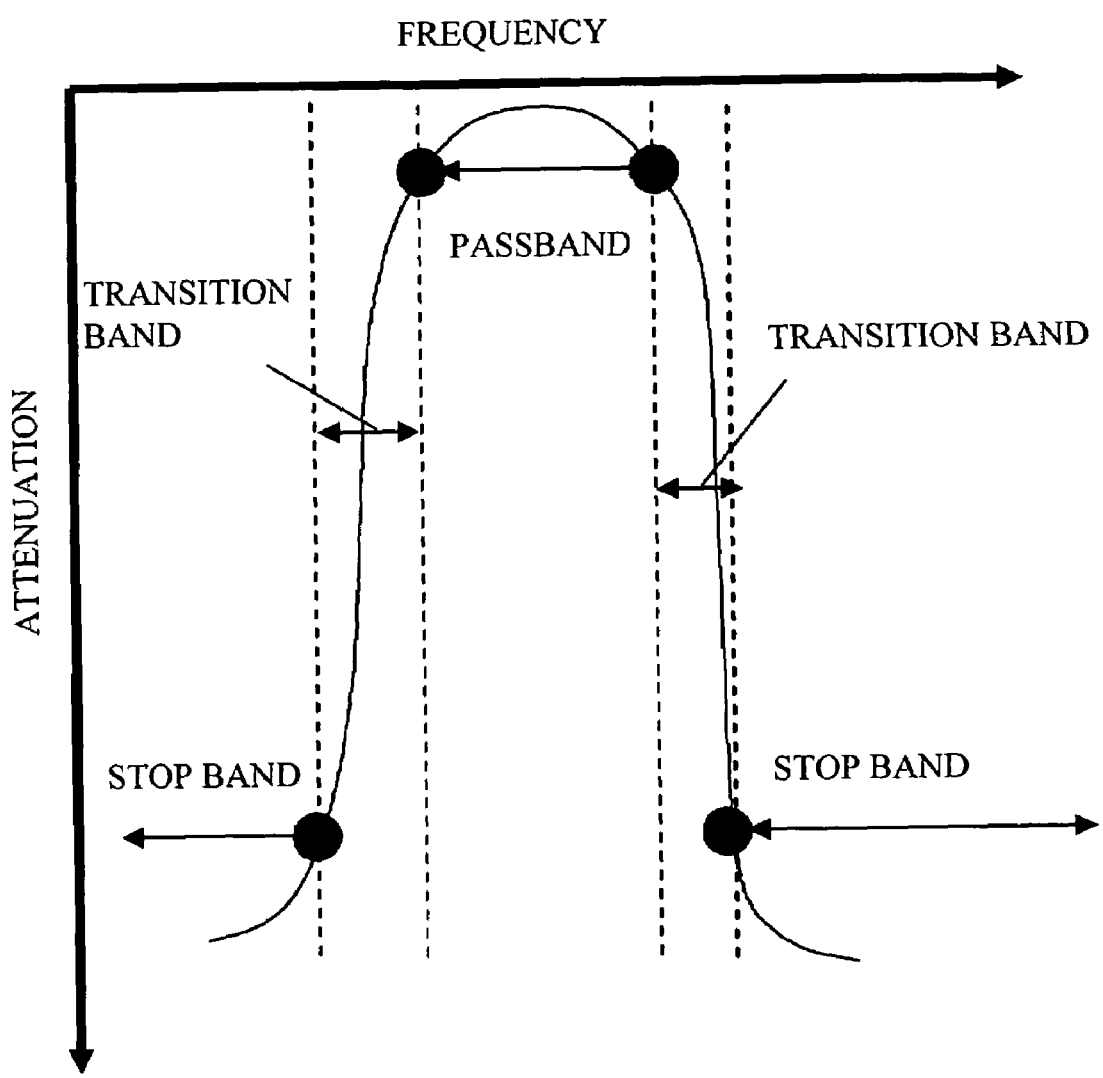
FIG. 6 is a graph showing transition bands in the transmission characteristic of the filter.

FIG. 5 shows the results of a simulation performed for examining the crosstalk from the transmission end to the reception end in a case where the high frequency filter (the reception filter 12) is the multimode filter 120, and a simulation performed for examining the crosstalk from the transmission end to the reception end in a case where the reception filter 12 is the ladder filter 110. In these simulations, the low frequency filter (the transmission filter 11) of the duplexer 1 is the ladder filter 110.

As is apparent from FIG. 5, the degree of suppression, especially the degree of suppression in the low frequency region (represented by the region surrounded by the broken line in FIG. 5), is improved with the multimode filter 120 as the reception filter 12, compared with the case of the ladder filter 110 as the reception filter 12. This is because the degree of stop-band suppression of the multimode filter 120 in that region is greater than that of the ladder filter 110 (also see FIG. 4). Judging from the results, it is obvious that more excellent characteristics in terms of crosstalk can be obtained with a structure having the multimode filter 120 as one of the two SAW filters of the duplexer 1.

The multimode filter 120, however, is poorer in power durability than the ladder filter 110. For this reason, if the two SAW filters 11 and 12 are formed with multimode filters 120, the power durability of the duplexer 1 greatly decreases. So as to maintain high power durability while improving the filter characteristics, it is preferable to employ the multimode filter 120 as one of the two SAW filters 11 and 12.

The ladder filter 110 and the multimode filter 120 (especially the IDTs 111, 112, 121, and 122) should preferably be made of the same metal with the same film thickness. This effectively simplifies the design and production process, and also cancels automatically variations of the center frequencies of the two SAW filters 11 and 12 caused by variations of the electrode film thicknesses and the electrode finger widths of process batches. Accordingly, simultaneous formation of the transmission filter 11 and the reception filter 12 brings about a correlation in the variations of the electrode film thicknesses and electrode finger widths that are caused during the production process. As a result, a correlation appears also in the variations of the center frequencies between the two filters 11 and 12. As the difference between the center frequencies of the two SAW filters 11 and 12 that change in synchronization with each other does not change greatly, desired filter characteristics can be easily obtained, and the yield of the duplexer 1 can be increased.

The IDTs 111, 112, 121, and 122 that form the two SAW filters 11 and 12 may be electrode films that are made of a metal mainly containing aluminum (Al), for example. However, it is also possible to form a single-layer structure that mainly contains a metal other than aluminum (Al), or to form a multi-layer structure that includes such single layers. The metal other than aluminum (Al) may be titanium (Ti), copper (Cu), gold (Au), molybdenum (Mo), tungsten (W), tantalum (Ta), chromium (Cr), platinum (Pt), ruthenium (Ru), or rhodium (Rh), for example.

The substrate 10 on which the two SAW filters 11 and 12 are formed may be a piezoelectric single-crystal substrate of 42° Y-cut X-propagation lithium tantalate that is a rotated Y-cut plate (hereinafter referred to as a LT substrate), or a piezoelectric single-crystal substrate of 42° Y-cut X-propagation lithium niobate that is a rotated Y-cut plate (hereinafter referred to as a LN substrate), for example. The substrate 10 may also be a piezoelectric substrate made of a piezoelectric material such as a certain kind of crystal (hereinafter referred to as a piezoelectric substrate). With a LT substrate, the insertion loss is small.

In a case where the transmission filter 11 (the ladder filter 110 in this embodiment) and the reception filter 12 (the multimode filter 120 in this embodiment) are formed on one substrate, i.e., in a case where two SAW filters of different types are formed on one substrate, it is difficult to obtain desired filter characteristics for both SAW filters, because the optimum design parameters, especially the optimum electrode film thicknesses of the IDTs 111, 112, 121, and 122, are different between the multimode filter 120 and the ladder filter 110. Therefore, the inventors have made an intensive study to determine the design conditions under which the ladder filer 110 and the multimode filter 120 exhibit excellent filter characteristics at the same time. The design conditions will be described below in detail.

First, variations in transition bands with respect to the electrode film thicknesses of the ladder filter 110 and the multimode filter 120 will be described. A transition band is a region on the boundary between a pass band and a stop band. In a case where the ladder filter 110 has a pass band of −3.5 dB and higher, and a stop band of −42 dB and lower, the transition band is a frequency region from −42 dB to −3.5 dB. Likewise, in a case where the multimode filter 120 has a pass band of −4 dB and higher, and a stop band of −50 dB and lower, the transition band is a frequency region from −50 dB to −4 dB.

Figure 7:
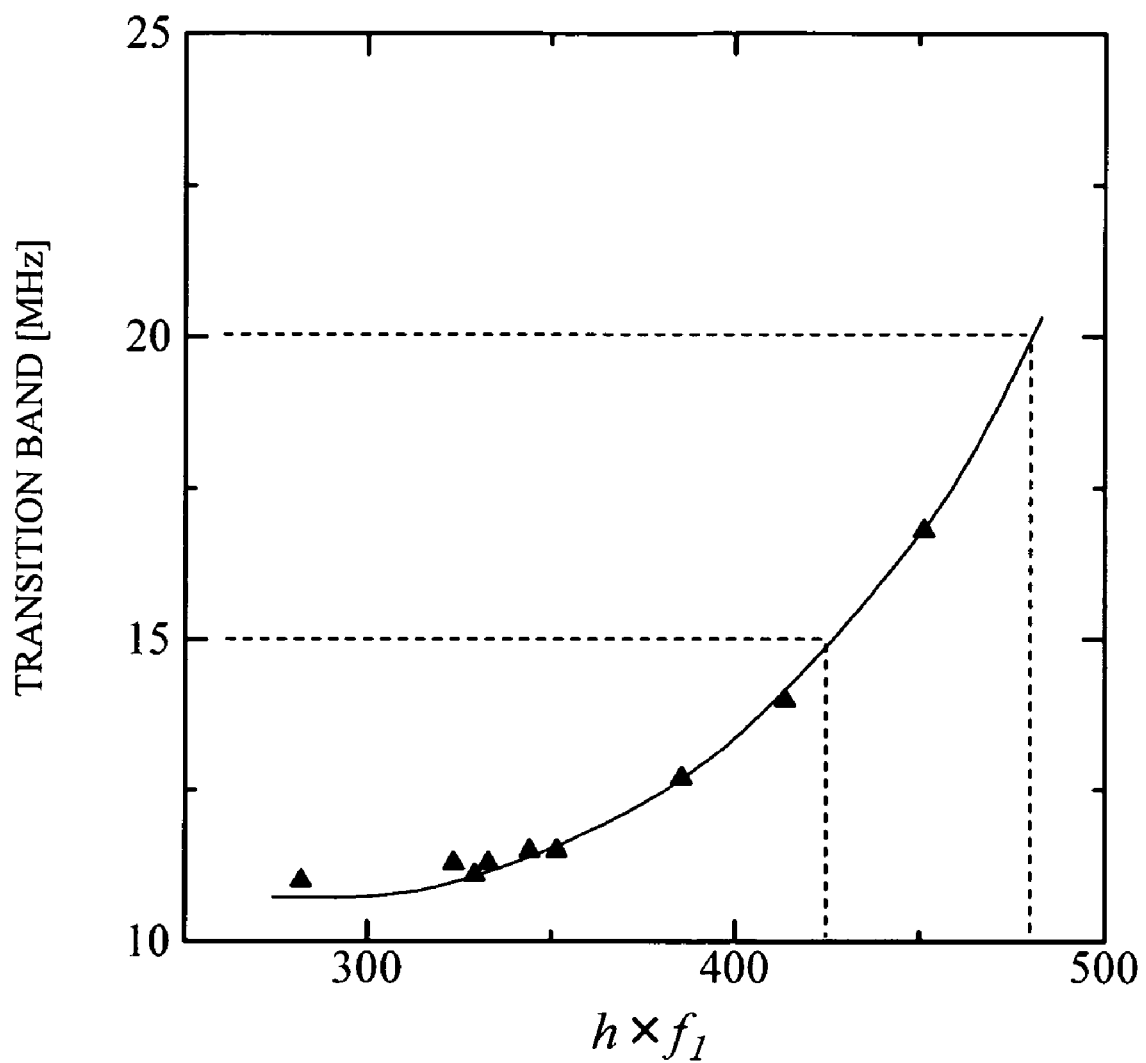
FIG. 7 is a graph showing transition band variation with respect to the electrode film thickness of the ladder filter of FIG. 2.

FIG. 7 is a graph showing the dependence of transition bandwidth of the ladder filter 110 to be incorporated into a 1.9 GHz band duplexer for the PCS (Personal Communications Services) on h×$f_1$. In this ladder filter 110, the substrate 10 is the above described LT substrate, and the IDTs 111 and 112 are formed by single-layer structures containing aluminum (Al) as the electrode material. In FIG. 7, the horizontal axis indicates the product h×$f_1$ of the center frequency $f_1$ and the film thickness h representing the thickness of the IDTs 111 and 112 of the ladder filter 110.

Figure 8:
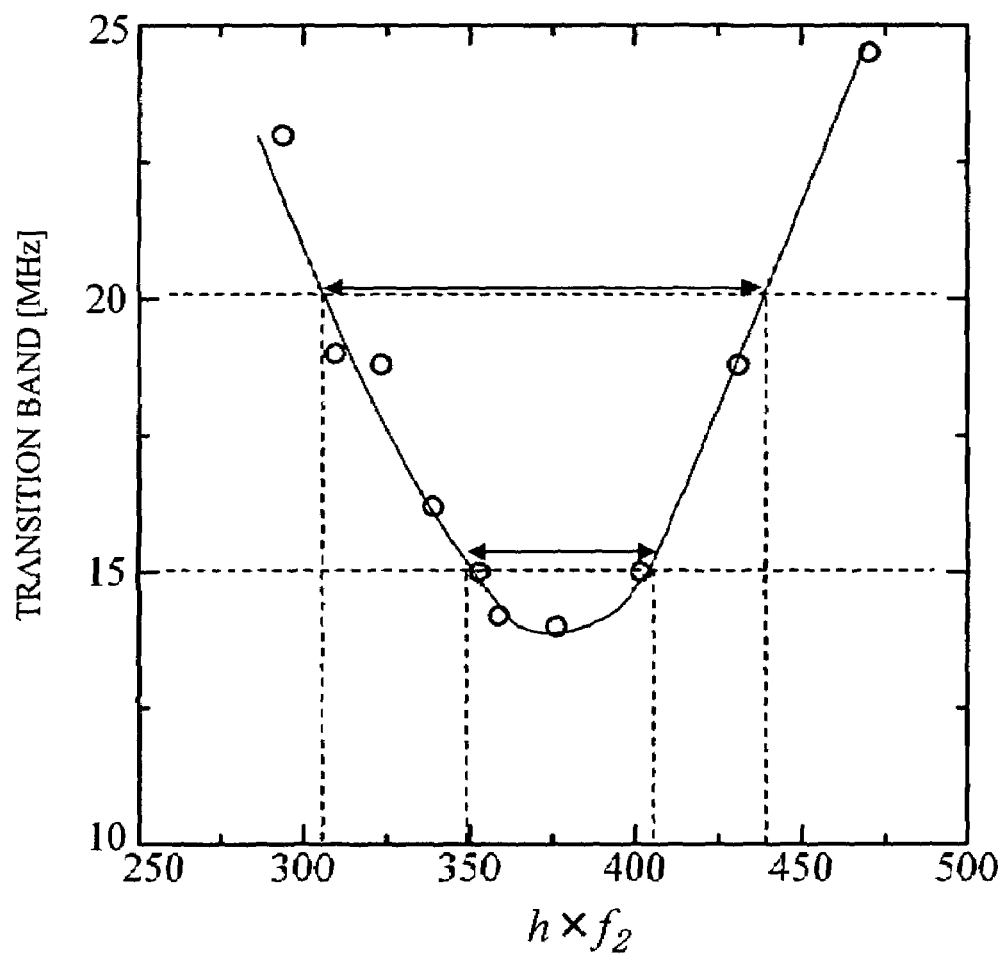
FIG. 8 is a graph showing transition band variation with respect to the electrode film thickness of the multimode filter of FIG. 3.

FIG. 8 is a graph showing the dependence of transition bandwidth of the multimode filter 120 to be incorporated into a 1.9 GHz band duplexer for the PCS on h×$f_2$. Like the ladder filter 110, the substrate 10 of this multimode filter 120 is the above described LT substrate, and the IDTs 121 and 122 are formed by single-layer structures containing aluminum (Al) as the electrode material. In FIG. 7, the horizontal axis indicates the product h×$f_2$ of the center frequency $f_2$ and the film thickness h representing the thickness of the IDTs 111 and 112 of the multimode filter 120.

The above ladder filter 110 is designed as a transmission filter (the transmission band: 1850 MHz to 1910 MHz) that conforms to the PCS standard, and the center frequency $f_1$ of the ladder filter 110 is 1880 MHz. The multimode filter 120 is designed as a reception filter (the reception band: 1930 MHz to 1990 MHz) that conforms to the PCS standard, and the center frequency $f_2$ is 1960 MHz.

Figure 9:
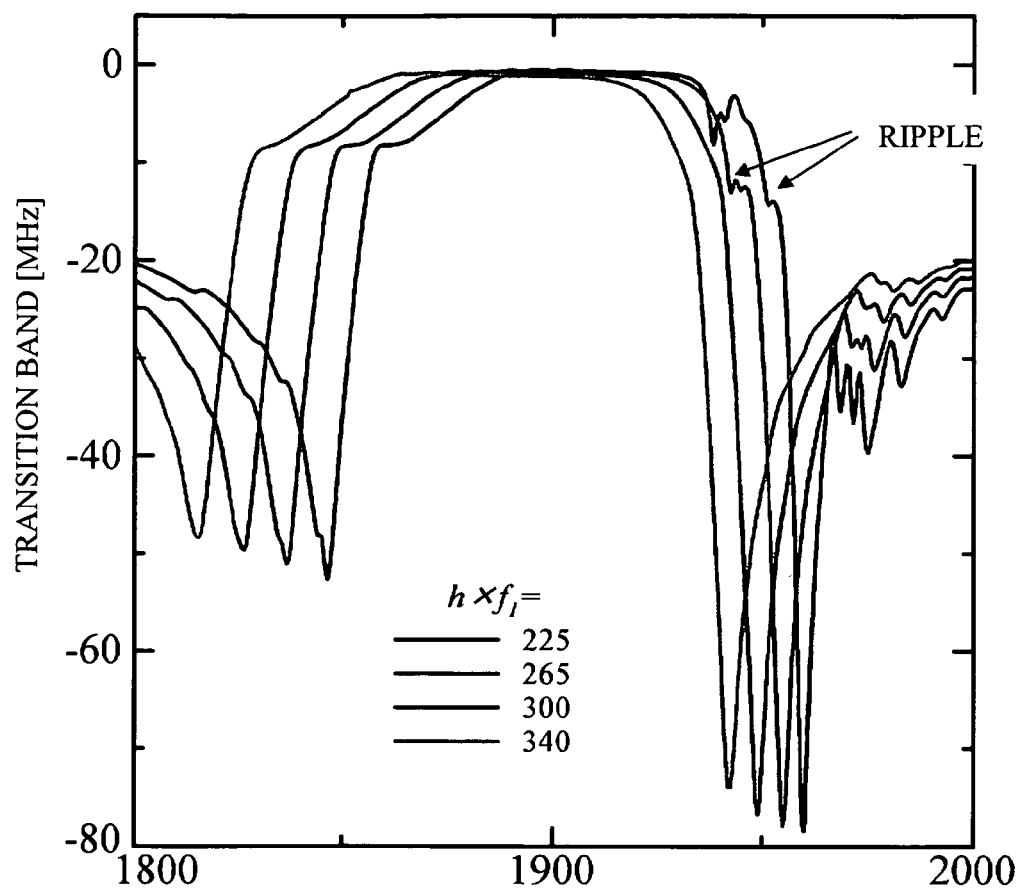
FIG. 9 is a graph showing the bandpass characteristics of the ladder filter of FIG. 2, with the value of the product of a thickness h and a center frequency $f_1$ being varied.

As the upper edge of the transmission band is 1910 MHz while the lower edge of the reception band is 1930 MHz, the gap between the transmission band and the reception band in the PCS is as narrow as 20 MHz. In such a situation that the transmission band and the reception band is very close to each other, the filter characteristics of the transmission filter 11 and the reception filter 12 need to have very steep cutoff characteristics. In the above example, the transmission filter 11 and the reception filter 12 need to have narrower transition band than 20 MHz. Judging from the filter characteristics of the ladder filter 110 shown in FIG. 7, the product h×$f_1$ should be 480 or smaller so as to obtain narrower transition band than 20 MHz. Judging from the filter characteristics of the multimode filter 120 shown in FIG. 8, the product h×$f_2$ should be in the range of 300 to 430 so as to obtain narrower transition band than 20 MHz. If the electrode film thickness of the ladder filter 11 is too thin, however, ripples appear in the pass band, as shown in FIG. 9. Therefore, the lower limit of the product h×$f_1$ should preferably be 300 or greater. FIG. 9 is a graph showing the pass band characteristics variations of the ladder filter 110 that are observed when the product h×$f_1$ is varied.

For the above reasons, in a case where the IDTs 111 and 112 forming the ladder filter 110 and the IDTs 121 and 122 forming the multimode filter 120 are made of a metal with the same film thickness in the duplexer 1 having the ladder filter 110 and the multimode filter 120 formed on the same plane of a substrate, the design conditions should be as follows:

$$300 \leq h \times f_1 \leq 480$$

$$300 \leq h \times f_2 \leq 430 \qquad (1)$$

where: h represents the film thickness of each of the IDTs 111, 112, 121, and 122; $f_1$ represents the center frequency of the ladder filter 11; and $f_2$ represents the center frequency of the multimode filter 12. In this manner, the transition band of the transmission filter 11 and the reception filter 12 can be 20 MHz or narrower, and the duplexer characteristics can be obtained which satisfies the PCS specifications, with suppressed crosstalk between transmission signals and reception signals can be reduced. Thus, improved filter characteristics can be obtained.

When the duplexer 1 is actually produced, it is more preferable to have a narrower transition band than 15 MHz, because there are variations in the electrode film thicknesses and electrode finger widths of the IDTs 111, 112, 121, and 122. So as to realize such a transition band, the design conditions should be as follows:

$$300 \leq h \times f_1 \leq 420$$

$$350 \leq h \times f_2 \leq 410 \qquad (2)$$

Although the 1.9 GHz band duplexer 1 has been described in the above description, the present invention is not limited to the 1.9 GHz band, but may also be applied to an 800 MHz band duplexer or a 2.0 GHz band duplexer. With such changes, the same effects as described above can still be obtained. Accordingly, the same graphs as those shown in FIGS. 7 and 8 can be obtained, regardless of change of the center frequencies of the ladder filter and the multimode filter.

Next, a duplexer 100 that has the above described structure and satisfies the above described design conditions will be described in detail.

Figure 10:
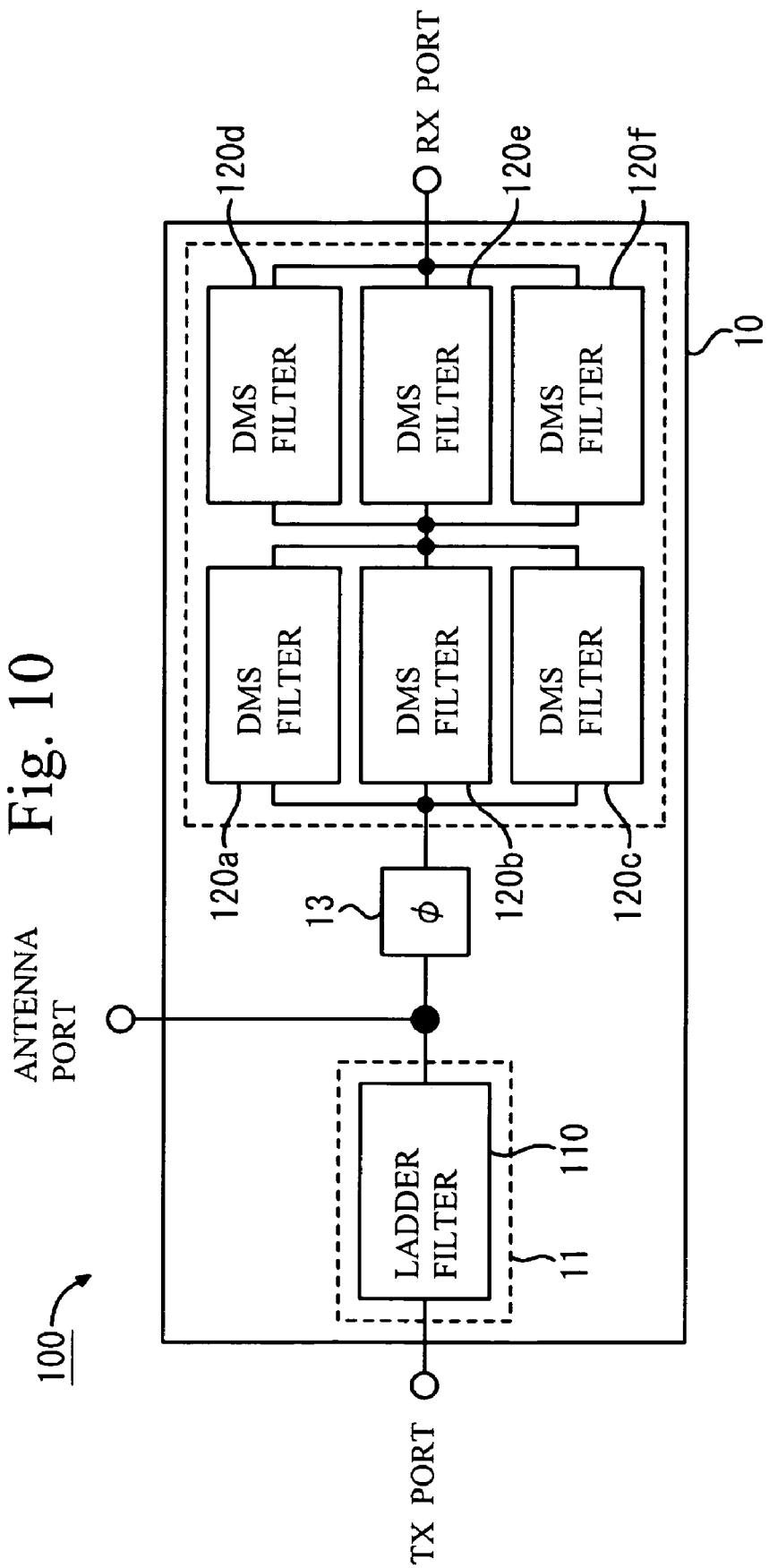
FIG. 10 is a block diagram illustrating the structure of a specific example of the duplexer in accordance with the first embodiment.

In this specific example, the above described duplexer 1 is produced as a 1.9 GHz band antenna duplexer to be used in the PCS. FIG. 10 illustrates the structure of the duplexer 100.

Figure 13:
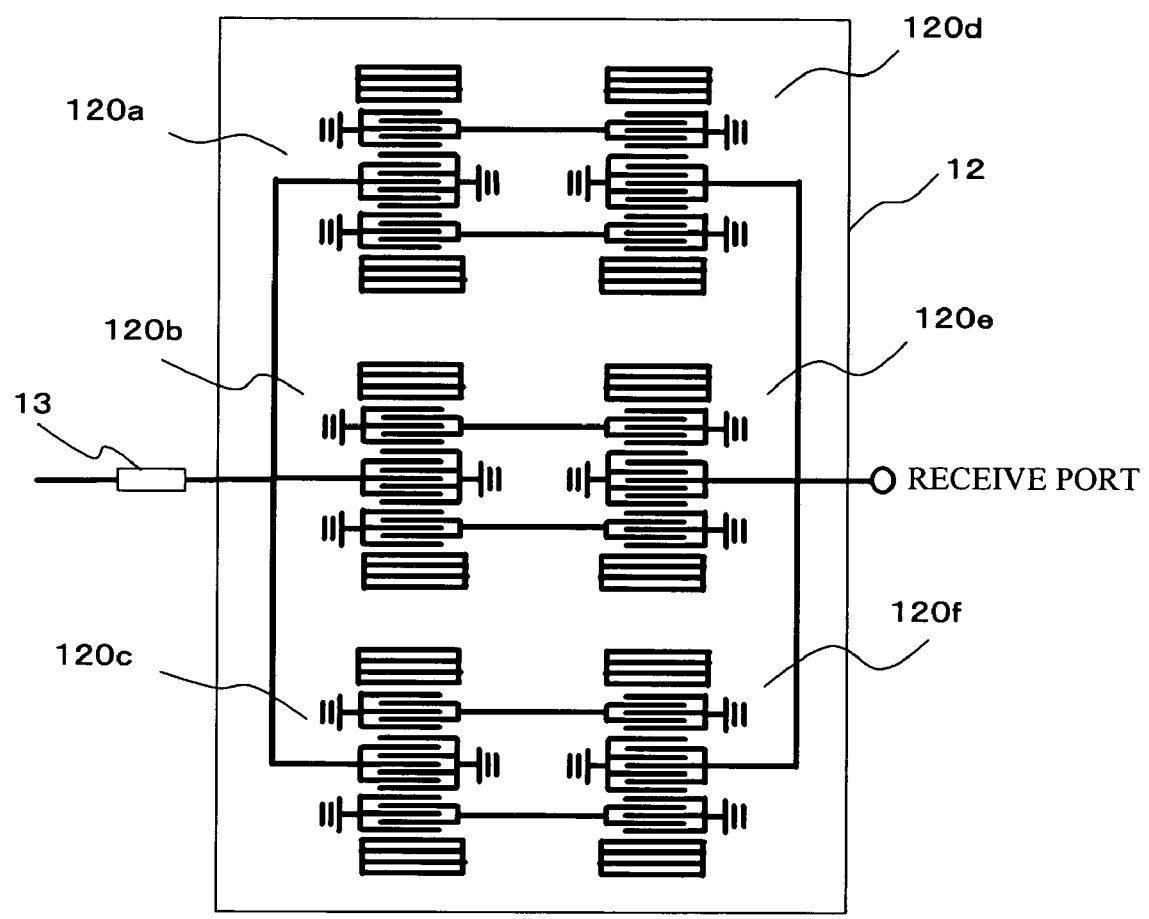
FIG. 13 illustrates the parallel-connected multi-stage DMS structure that is employed in the duplexer shown in FIG. 10.

In this specific example, an LT substrate is employed as the substrate 10. The transmission filter 11 formed on the substrate 10 is the ladder filter 110 of a four-stage structure having four series-arm resonators, as shown in FIG. 2. The reception filter 12 formed on the substrate 10 is a parallel-connected two-stage DMS filter that includes multimode filters 120a through 120f each having three IDTs 121 and 122 arranged in a row and also having reflectors arranged at either end, as shown in FIG. 3. In this structure, the multimode filters 120a through 120c are connected to one side, and the multimode filters 120d through 120f are connected to the other side. FIG. 13 shows the connection relationship among the multimode filters 120a through 120f. Although FIG. 13 shows a single-phase input/output configuration, it is possible to employ a balanced input/output configuration. Further, the phase shifter 13 is provided between the input end of the reception filter 12 and the antenna port.

The IDTs 111, 112, 121, and 122 (see FIGS. 2 and 3) that form the ladder filter 110 and the multimode filters 120a through 120f are single-layer structures that are produced simultaneously on the substrate 10. Each of the IDTs 111, 112, 121, and 122 has a single layer made of an electrode material mainly containing aluminum (Al), and the film thickness h of each of the IDTs 111, 112, 121, and 122 is 0.18 μm.

Accordingly, the value obtained by multiplying the film thickness h ($=1.8 \times 10^{-7}$ m) by the center frequency $f_1$ ($=1.88 \times 10^9$ Hz) of each transmission filter 11 is approximately 338, and the value obtained by multiplying the film thickness h ($=1.8 \times 10^{-7}$ m) by the center frequency $f_2$ ($=1.96 \times 10^9$ Hz) of the reception filter 11 is approximately 353, both of which satisfy the design conditions represented by the expressions (1). These values also satisfy the design conditions represented by the expression (2).

Figure 11:
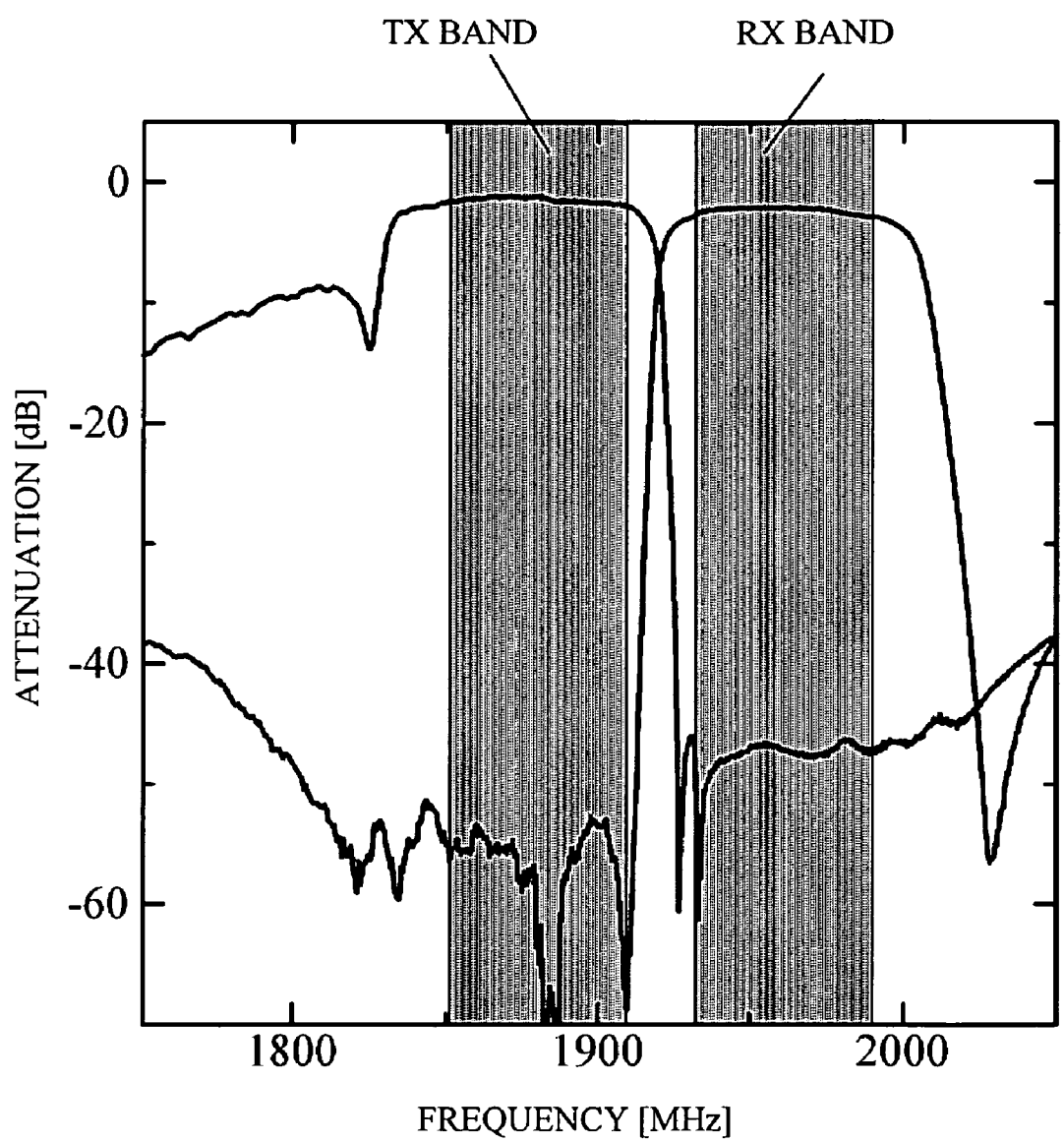
FIG. 11 is a graph showing the bandpass characteristics observed from the transmission side of the duplexer of FIG. 10 to the antenna and the bandpass characteristics observed from the antenna to the reception side.

FIG. 11 shows the bandpass characteristics observed from the transmission side of the duplexer 100 to the antenna (i.e., the bandpass characteristics of the transmission filter 11) and the bandpass characteristics observed from the antenna to the reception side of the duplexer 100 (i.e., the bandpass characteristics of the reception filter 12). As is apparent from FIG. 11, the insertion loss is −3.5 dB or smaller in the transmission band, and is −4 dB or smaller in the reception band. The degree of suppression −50 dB or greater in the transmission band, and is −45 dB or greater in the reception band. From these results, the duplexer 100 of this specific example proves to be useful in practical use.

Figure 12:
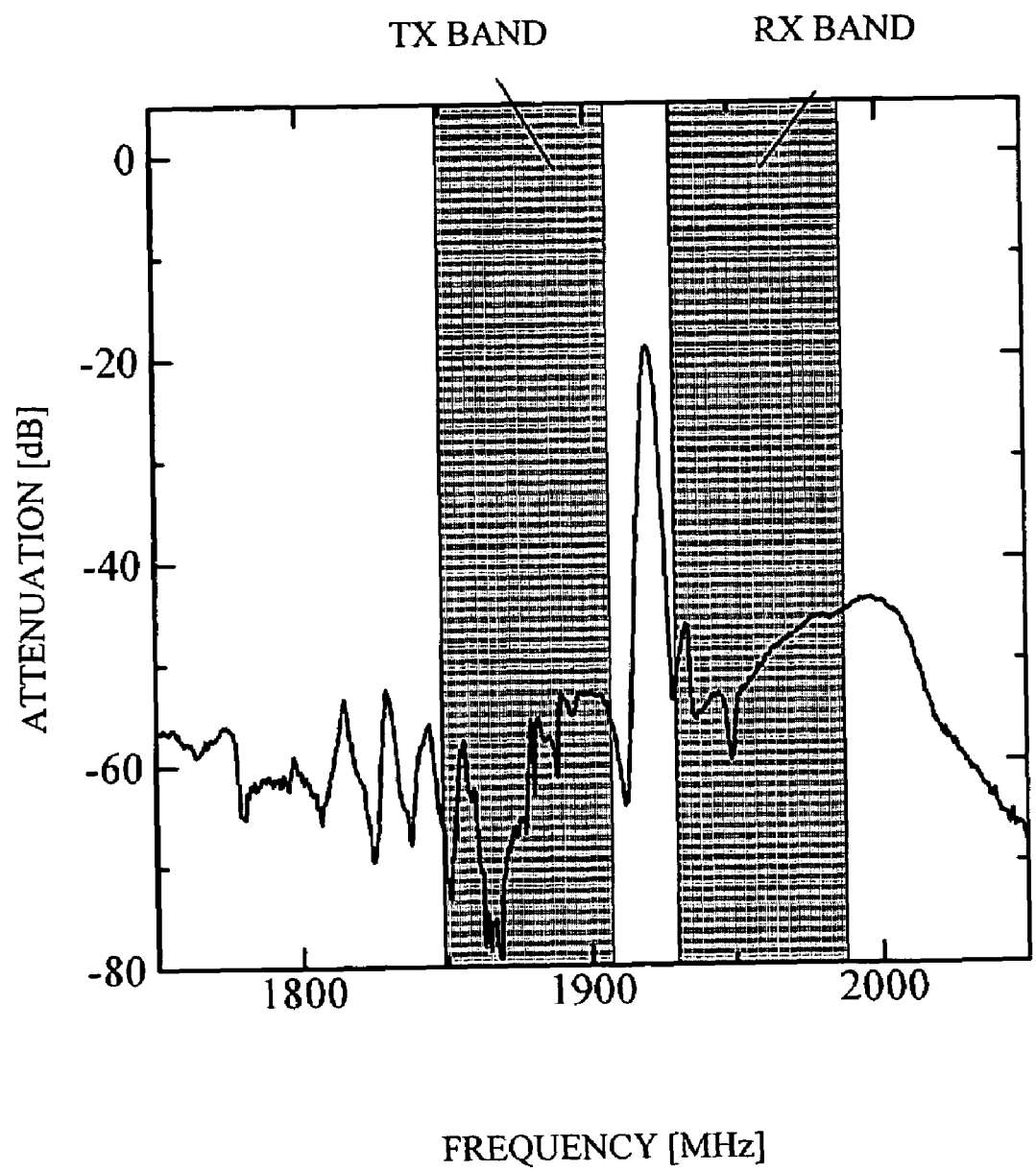
FIG. 12 is a graph showing the crosstalk characteristics observed from the transmission side to the reception side of the duplexer shown in FIG. 10.

FIG. 12 shows the crosstalk characteristics observed from the transmission side to the reception side of the duplexer 100. As is apparent from FIG. 12, crosstalk is restrained to −50 dB or greater in the transmission band, and is restrained to −42 dB or greater in the reception band. With these results, the duplexer 100 of this specific example proves to have excellent characteristics and to be useful in practical use.

As the above described duplexer has electrodes made of the same electrode material with the same film thickness on the same substrate, the production process is simplified, and the production yield is increased.

Second Embodiment

A second embodiment of the present invention will now be described in detail. As in the first embodiment, the transmission filter 11 is the ladder filter 110 in this embodiment, and the reception filter 12 is the multimode filter 120 in this embodiment. In the first embodiment described above, each of the IDTs 111, 112, 121, and 122 of the transmission filter 11 and the reception filter 12 is a single-layer structure made of an electrode material mainly containing aluminum (Al).

Generally, it is preferable to form the IDTs 111 and 112 of the transmission filter 11 with electrode films having high power durability, because larger power is normally applied to the transmission filter 11 than to the reception filter 12. In view of this, the IDTs 111 and 112 are formed with electrode films having relatively high power durability in this embodiment.

More specifically, examples of electrode films having high power durability include metallic films each having a three-layer structure of aluminum-copper/copper/aluminum-copper (Al—Cu/Cu/Al—Cu), a multi-layer structure in which a material mainly containing aluminum (Al) and titanium are laminated, a laminated structure of aluminum-magnesium (Al—Mg), and a laminated structure of aluminum-copper-magnesium (Al—Cu—Mg).

When the IDTs 111 and 112 of the transmission filter 11 (the ladder filter 110) are formed with the electrode films described above, it is effective to form the IDTs 121 and 122 of the reception filter 12 (the multimode filter 120) having the same layer structures through the same manufacturing procedures. By doing so, the power durability of the duplexer 1 is increased. Since electric power leaking from the transmission filter 11 flows into the reception filter 12, it is necessary for the reception filter 12 to have a certain degree of power durability. As the reception filter 12 is formed with electrode films having the same power durability as those of the transmission filter 11 as described above, the power durability of the reception filter 12 (the multimode filter 120) can be increased. Also, the IDTs 111, 112, 121, and 122 of the transmission filter 11 and the reception filter 12 that are formed as the same layer structures through the same procedures are advantageous not only in that the production process can be simplified, but also in that variations in the filter characteristics due to electrode thickness variations and electrode finger width variations can be restrained.

In a case where the IDTs 111, 112, 121, and 122 are made of an electrode material other than aluminum (Al), the electrode film thickness changes due to the difference in specific gravity between the employed electrode material and aluminum (Al). In this embodiment, however, the specific gravity of the electrode material with respect to aluminum is multiplied in a case where the IDTs 111, 112, 121, and 122 are formed with single- or multi-layer structures including layers made of the electrode material other than aluminum (Al). By doing so, the specific gravity of the electrode material is converted to the electrode film thickness substantially equivalent to that of aluminum (Al), and the value of the electrode film thickness should satisfy the design conditions defined by the expressions (1). Here, the design conditions in accordance with this embodiment are as follows:

$$300 \leq f_1 \times \sum_{k=1}^{n} (a_k \times h_k) \leq 480 \qquad (3)$$

$$300 \leq f_2 \times \sum_{k=1}^{n} (a_k \times h_k) \leq 430$$

where: $h_k$ represents the film thickness of each kth layer of the IDTs 111, 112, 121, and 122 (k being a natural number), and $a_k$ represents the specific gravity of the electrode material of the kth layers with respect to aluminum (Al).

Like the first embodiment, when variations in the electrode film thicknesses and electrode finger widths of the IDTs 111, 112, 121, and 122 that form the duplexer 1 are taken into consideration, the transition band is considered to be 15 MHz rather than 20 MHz. Therefore, the design conditions are set as follows:

$$300 \leq f_1 \times \sum_{k=1}^{n} (a_k \times h_k) \leq 420 \qquad (4)$$

$$350 \leq f_2 \times \sum_{k=1}^{n} (a_k \times h_k) \leq 410$$

With these design conditions, the duplexer characteristics can be obtained which satisfies the PCS specifications with the suppressed crosstalk between transmission signals and reception signals in the same manner as in the first embodiment, even if the IDTs 111, 112, 121, and 122 of single- or multi-layer structures are made of an electrode material other than aluminum (Al). Thus, a duplexer having excellent filter characteristics can be produced.

In a case where the IDTs 111, 112, 121, and 122 are formed with electrode films having multi-layer structures, however, the filter insertion loss increases due to the greater electric resistance than those formed with single-layers structures made of aluminum (Al). So as to counter such a problem, this embodiment employs a structure in which multimode filters 120 are connected in parallel in the same manner as in the structures of the first embodiment shown in FIGS. 10 and 13. By doing so, the electric resistance of the reception filter 12 can be reduced, and the filter insertion loss is also reduced. The other aspects of this embodiment are the same as those of the first embodiment, and therefore, explanation of them is omitted herein.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present application is based on Japanese Patent Application No. 2003-121871 filed on Apr. 25, 2003, the entire disclosure of which is hereby incorporated by reference.

What is claimed is:

1. A duplexer comprising
a ladder filter and a multimode filter that are formed on an identical surface of a predetermined substrate,
a first comb-like electrode of the ladder filter and a second comb-like electrode of the multimode filter having an identical layer structure with an equal film thickness,
the first comb-like electrode and the second comb-like electrode being formed with single-layer films mainly containing aluminum,
the relationship among the film thickness h, in meters, of the first comb-like electrode and the second comb-like electrode, the center frequency $f_1$, in Hertz, of the frequency band of the ladder filter, and the center frequency $f_2$, in Hertz, of the frequency band of the multimode filter, being expressed as:

$300 \leq h \times f_1 \leq 480$ $300 \leq h \times f_2 \leq 430$.

2. The duplexer as claimed in claim 1, wherein the relationship among the film thickness h, the center frequency $f_1$, and the center frequency $f_2$, is expressed as:

$300 \leq h \times f_1 \leq 420$ $350 \leq h \times f_2 \leq 410$.

3. The duplexer as claimed in claim 1, wherein the predetermined substrate is a rotated Y-cut X-propagation lithium tantalate substrate on which surface acoustic wave propagates in the X direction.

4. The duplexer as claimed in claim 1, comprising a plurality of multimode filters.

5. A duplexer comprising
a ladder filter and a multimode filter that are formed on an identical surface of a piezoelectric substrate,
a first comb-like electrode of the ladder filter and a second comb-like electrode of the multimode filter having an identical layer structure with an equal film thickness,
the first comb-like electrode and the second comb-like electrode being formed with single-layer films mainly containing aluminum, or single- or multi-layer films including n layers (n being an integer of 1 or greater), the n layers including a layer mainly containing a metal other than aluminum,
the relationship among the film thickness $h_k$, in meters, of the kth layer (k being an integer of 1 or greater) of the first comb-like electrode and the second comb-like electrode, the specific gravity $a_k$ of the metal of the kth layer with respect to aluminum, the center frequency $f_1$, in Hertz, of the frequency band of the ladder filter, and the center frequency $f_2$, of the frequency band of the multimode filter, being expressed as:

$$300 \leq f_1 \times \sum_{k=1}^{n} (a_k \times h_k) \leq 480$$

$$300 \leq f_2 \times \sum_{k=1}^{n} (a_k \times h_k) \leq 430.$$

6. The duplexer as claimed in claim 5, wherein the relationship among the film thickness $h_k$, the specific gravity $a_k$, the center frequency $f_1$, and the center frequency $f_2$, is expressed as:

$$300 \leq f_1 \times \sum_{k=1}^{n} (a_k \times h_k) \leq 420$$

$$350 \leq f_2 \times \sum_{k=1}^{n} (a_k \times h_k) \leq 410.$$

* * * * *